(12) United States Patent
Im et al.

(10) Patent No.: US 7,372,148 B2
(45) Date of Patent: May 13, 2008

(54) SEMICONDUCTOR CHIP HAVING COOLANT PATH, SEMICONDUCTOR PACKAGE AND PACKAGE COOLING SYSTEM USING THE SAME

(75) Inventors: Yun-Hyeok Im, Gyeonggi-do (KR); Jae-Wook Yoo, Gyeonggi-do (KR); Hee-Seok Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 101 days.

(21) Appl. No.: 11/274,588

(22) Filed: Nov. 14, 2005

(65) Prior Publication Data

US 2006/0131737 A1 Jun. 22, 2006

(30) Foreign Application Priority Data

Dec. 20, 2004 (KR) ............... 10-2004-0108783

(51) Int. Cl.
*H01L 23/34* (2006.01)

(52) U.S. Cl. ............... 257/714; 257/713; 257/719; 257/E23.088

(58) Field of Classification Search ............... 438/712, 438/713, 714, 719
See application file for complete search history.

(56) References Cited

U.S. PATENT DOCUMENTS

| 6,351,384 B1* | 2/2002 | Daikoku et al. ............ 361/704 |
| 6,801,429 B2 | 10/2004 | Tsai et al. |
| 7,032,392 B2* | 4/2006 | Koeneman et al. ............ 62/77 |

FOREIGN PATENT DOCUMENTS

| JP | 06-061391 | 3/1994 |
| JP | 10-261748 | 9/1998 |

OTHER PUBLICATIONS

English language abstract of Japanese Publication No. 06-061391.
English language abstract of Japanese Publication No. 10-261748.

* cited by examiner

*Primary Examiner*—David A. Zarneke
*Assistant Examiner*—Jenny L Wagner
(74) *Attorney, Agent, or Firm*—Marger Johnson & McCollom, P.C.

(57) ABSTRACT

The present invention relates to a semiconductor chip coolant path, a semiconductor package utilizing the semiconductor chip coolant path, and a cooling system for the semiconductor package. For effective dissipation of heat generated during semiconductor chip operation, a semiconductor chip having a coolant path formed through or adjacent to its backside and a semiconductor package utilizing the semiconductor chip are provided. In addition, a cooling system for the semiconductor package circulates a coolant through the coolant path within the semiconductor package to directly contact and cool the semiconductor chip.

43 Claims, 13 Drawing Sheets

US 7,372,148 B2

SEMICONDUCTOR CHIP HAVING COOLANT PATH, SEMICONDUCTOR PACKAGE AND PACKAGE COOLING SYSTEM USING THE SAME

CROSS REFERENCE TO RELATED APPLICATIONS

This U.S. non-provisional application claims benefit of priority under 35 U.S.C. §119 of Korean Patent Application No. 2004-108783, filed on Dec. 20, 2004, the entire contents of which are incorporated herein by reference.

BACKGROUND OF THE INVENTION

1. Field of the Invention

The present invention relates generally to a semiconductor package and, more particularly, to coolant path and cooling system for a semiconductor package.

2. Description of the Related Art

Transistors are basic units of integrated circuits forming a semiconductor chip. Over time, semiconductor chip manufactures integrate ever-increasing numbers of transistors in integrated circuits. As the number of the transistors integrated in a semiconductor chip rapidly increases so does the heat generated by the device during operation. Clock speed can also increase heat generated by an operating integrated circuit. Managing heat generated by the operating semiconductor chip has become an important technical issue. Heat may cause permanent damage to the semiconductor chip. As temperature increases chip failure rates increase and limit clock speeds. Consequently, effective dissipation of heat becomes a crucial problem for semiconductor packages.

In a conventional semiconductor package, the heat generated from the semiconductor dissipates externally via its external interface terminals or surfaces of the semiconductor package. For more effective heat dissipation, a heat sink may be attached to a surface of the semiconductor package. For example, in the case of a ball grid array (BGA) package having a plastic resin molding compound encapsulating the semiconductor chip, the heat sink is directly attached to a surface of the molding compound. The molding compound transfers heat energy via conduction to the heat sink and the heat sink dissipates the heat via convection.

Unfortunately, because the plastic resin making up the molding compound has a relatively low thermal conductivity, the efficiency of heat dissipation through the heat sink attached to the surface of the molding compound is similarly low.

To solve this problem, liquid cooling methods have been suggested for circulating a coolant relative to the semiconductor package, as disclosed in U.S. Pat. No. 6,801,429 and Japanese Patent Laid-Open Publication No. 6-61391.

As shown in FIG. 1, a semiconductor package cooling system 10, disclosed in U.S. Pat. No. 6,801,429, comprises a semiconductor package 1 having a coolant path 4 within its molding compound 7. The system 10 dissipates heat generated from a semiconductor chip 2 by circulating a coolant through the coolant path 4 within the molding compound 7.

Both ends of the coolant path 4 are connected to a coolant pipe 8 with a heat exchanger 9 interposed therealong. The coolant circulates by way of a pump 5, operating along the coolant pipe 8 between the heat exchanger 9 and the semiconductor package 1 at the outlet side of the outlet of the coolant path 4.

The semiconductor package 1 is a BGA package, in which the semiconductor chip 2 mounts on the upper surface of a substrate 3 and solder balls 6 protrude from the lower surface of the substrate 3. The portion where the semiconductor chip 2 mounts is protected by the molding compound 7, which is made by encapsulation with liquid plastic resin. The coolant path 4 is formed within the molding compound 7 and above the semiconductor chip 2.

Compared with the prior art heat sink, the semiconductor package cooling system 10 may have higher heat dissipation efficiency. Again, however, because the coolant path 4 is formed within the molding compound 7 having a low thermal conductivity, it may be difficult to cool effectively the semiconductor chip 2.

In addition, the coolant path 4 formed within the molding compound 7 may cause an increase in the overall thickness of the semiconductor package 1, thereby contradicting a general trend towards thinner and smaller semiconductor packaging.

On the other hand, as shown in FIG. 2, a liquid cooled semiconductor package 11, disclosed in Japanese Patent Laid-Open Publication No. 6-61391, is a ceramic package having a base substrate 13, a semiconductor chip 12 mounted on the base substrate 13, and a lid 15 hermetically sealing the base substrate 13 and the semiconductor chip 12. This hermetic seal forms a package body 17. A coolant path 14 passes through the base substrate 13.

By circulating a coolant through the coolant path 14 of the base substrate 13, as attached to the back surface of the semiconductor chip 12, the liquid-cooled semiconductor package 11 may have higher heat dissipation efficiency than the semiconductor package cooling system 10 shown in FIG. 1.

However, the base substrate 13, acting as a heat transfer medium, lying between the coolant path 14 and the semiconductor chip 12, may become an obstacle to effective cooling of the semiconductor chip 12.

In addition, the coolant path 14 formed within the base substrate 13 may cause the base substrate 13 to become thicker, thereby increasing the overall thickness of the semiconductor package 11.

Accordingly, there is a need to form an improved coolant path enabling effective cooling of the semiconductor chip while facilitating the general trend toward smaller integrated circuit packaging.

SUMMARY OF THE INVENTION

Some embodiments of the present invention include a semiconductor chip equipped with a coolant path, and a liquid cooled semiconductor package capable of directly cooling the semiconductor chip with a coolant passing therethrough or thereby.

According to embodiments of the present invention, the semiconductor chip may comprise a coolant path of a designated depth formed from at the back surface of the semiconductor chip, e.g., opposite to the active surface having a plurality of electrode pads.

The coolant path may be formed along the back surface beginning at one side surface adjoining the back surface to another side surface adjoining the back surface.

The coolant path may comprise an inlet of a designated length formed from one side surface adjoining the back surface towards the inside of the back surface, a cooling compartment linked with the inlet and located at, for example, a central region of the back surface, and an outlet of a designated length linked with the cooling compartment and formed towards, for example, another side surface adjoining the back surface.

The cooling compartment of a designated depth may be formed at the central region of the back surface in a generally pocket-like shape. The cooling compartment may also be formed as a conduit in, for example, a zigzag or other formed shape.

The coolant path may be formed linearly in the back surface of the semiconductor chip.

The semiconductor chip may further comprise a metal layer formed on the back surface for hermetical adhesion.

The coolant path may be coated in relation to the coolant material, e.g., a water-repellant coating for a water or water-based coolant.

According to a particular embodiment of the present invention, the semiconductor package may comprise a semiconductor chip equipped with a coolant path of a designated depth formed from the back surface of the semiconductor chip opposite to the active surface having a plurality of electrode pads; a substrate, wherein the back surface of the semiconductor chip is hermetically attached on the upper surface thereof; a coolant tubule connected with the coolant path for circulating a coolant through the coolant path to cool the semiconductor chip; a bonding wire electrically connecting the electrode pad of the semiconductor chip with the substrate; a plastic resin molding compound encapsulating the semiconductor chip on the upper surface of the substrate wherein both ends of the coolant tubule protrude from the side surfaces of the molding compound, the coolant tubule, and the bonding wire; and an external interface terminal formed on the lower surface of the substrate.

The semiconductor package may further comprise a substrate coolant path formed on the upper surface of the substrate corresponding to the coolant path of the semiconductor chip. The coolant tubule may be installed between the coolant path of the semiconductor chip and the substrate coolant path.

According to particular embodiments of the present invention, the system for cooling a semiconductor package may comprise the semiconductor package described above; a coolant reservoir; a coolant pipe connecting the coolant reservoir and the coolant tubule of the semiconductor package so that a coolant is guided to circulate from the coolant reservoir through the semiconductor package back to the coolant reservoir; a heat exchanger cooling the coolant coming from the semiconductor package; and a pump installed at the coolant pipe for forcing the coolant to circulate.

According to one aspect of embodiments of the present invention, the integrated circuit at its back surface cooperates with the substrate to form a coolant path, each contributing to containment of the coolant along the path to pass the coolant in contact with the integrated circuit.

BRIEF DESCRIPTION OF THE DRAWINGS

FIGS. 7 and 8 are perspective views showing the backside of a wafer utilized for manufacturing the semiconductor chip equipped with a coolant path; FIG. 9 is a perspective view showing the step of forming the coolant path in the backside of the semiconductor chip; FIG. 10 is a perspective view showing the step of cutting the wafer into individual semiconductor chips; FIG. 11 is a sectional view showing the step of mounting the semiconductor chip on a substrate; FIG. 12 is a sectional view showing the step of installing a coolant tubule to connect to the coolant path; FIG. 13 is a sectional view showing the step of electrically connecting the semiconductor chip to the substrate via a bonding wire; and FIG. 14 is a sectional view showing the step of forming a molding compound.

DETAILED DESCRIPTION

Hereinafter, example embodiments of the present invention will be described in detail with reference to the accompanying drawings.

First Example Embodiment

Figure 1:
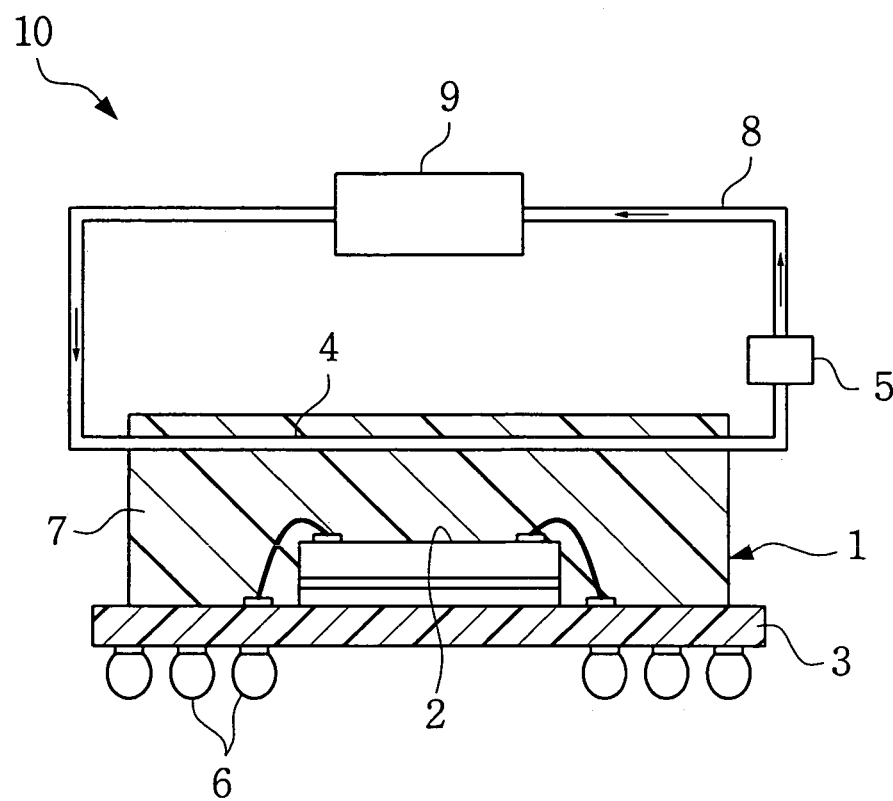
FIG. 1 is a partial sectional view showing a prior art semiconductor package cooling system.
Figure 2:
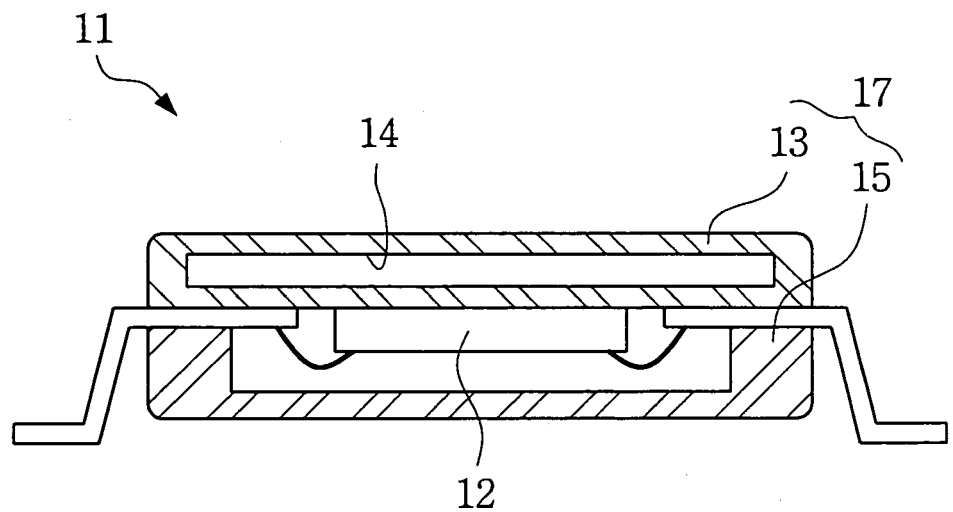
FIG. 2 is a cross-sectional view showing a prior art liquid cooled semiconductor package.
Figure 3:
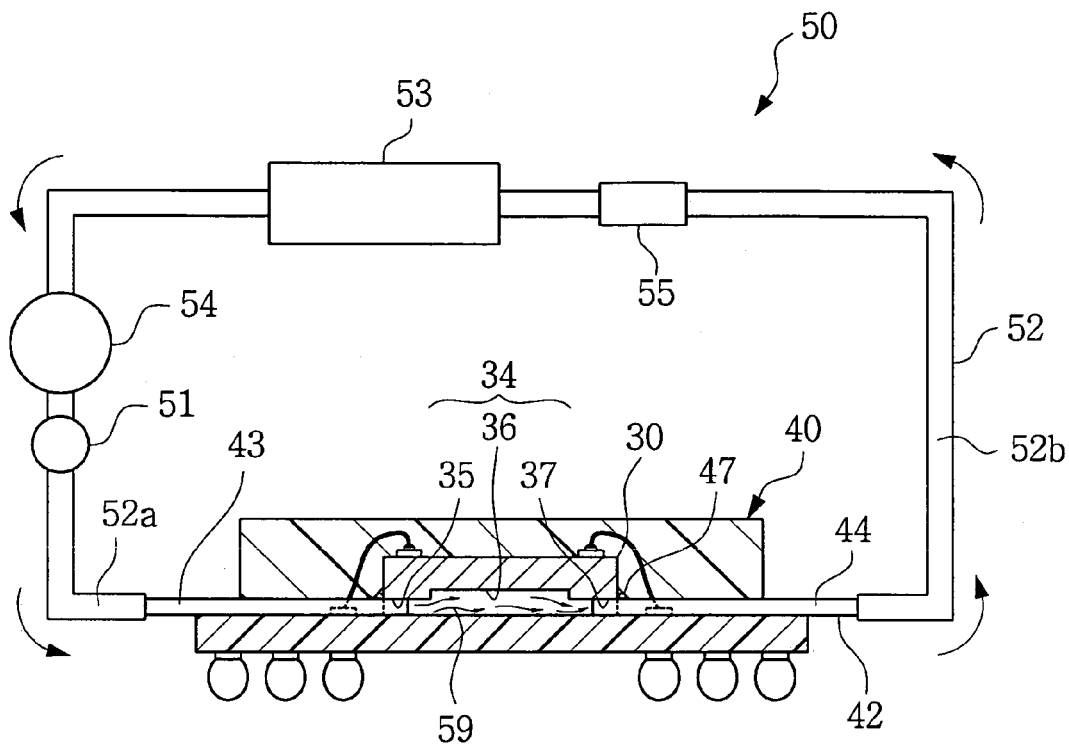
FIG. 3 is a partial cross-sectional view showing a cooling system of a semiconductor package having a semiconductor chip equipped with a coolant path, according to an embodiment of the present invention.
Figure 4:
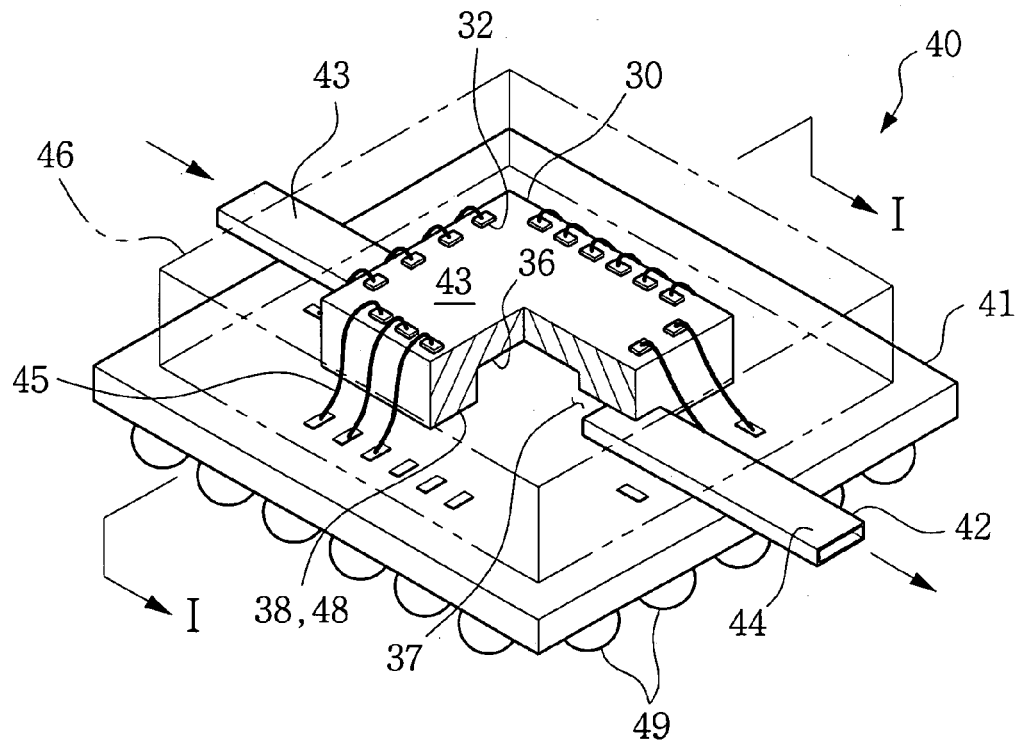
FIG. 4 is a partially sectioned perspective view showing the semiconductor package of FIG. 3.
Figure 5:
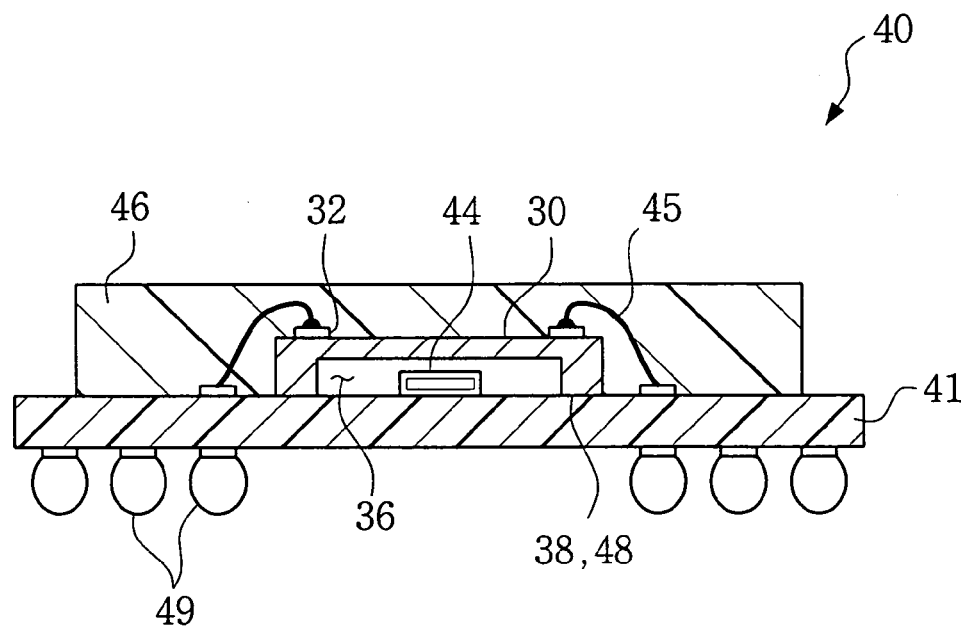
FIG. 5 is a sectional view showing the semiconductor package taken along line I-I in FIG. 4.
Figure 6:
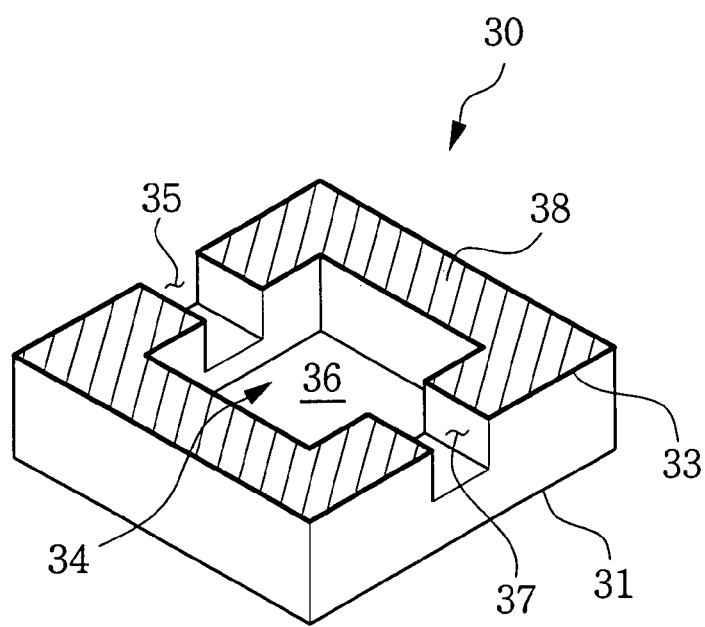
FIG. 6 is a perspective view showing the backside of the semiconductor chip of FIG. 3.

FIG. 3 is a partial sectional view showing a cooling system 50 of a semiconductor package 40 having a semiconductor chip 30 equipped with a coolant path 34, according to a first example embodiment of the present invention. FIG. 4 is a partially sectioned perspective view showing the semiconductor package 40 of FIG. 3. FIG. 5 is a sectional view showing the semiconductor package 40 taken along the line I-I in FIG. 4. FIG. 6 is a perspective view showing the backside of the semiconductor chip 30 of FIG. 3.

Referring to FIGS. 3 to 6, the cooling system 50 of the semiconductor package 40 of the first example embodiment improves cooling of the semiconductor chip 30 by bringing a coolant 59 into direct contact with the semiconductor chip 30. A coolant pipe 52 circulates the coolant 59 between the semiconductor package 40 and a heat exchanger 53. A pump 54 connects along the coolant pipe 52 and circulates the coolant 59 along the coolant pipe 52. The coolant pipe 52 comprises a first coolant pipe 52a carrying the coolant 59 coming from the heat exchanger 53 to the semiconductor package 40, and a second coolant pipe 52b carrying the coolant 59 coming from the semiconductor package 40 to the heat exchanger 53.

The heat exchanger 53 cools the hot coolant 59 after having passed through the semiconductor package 40, and may be an air-cooled heat exchanger. While the coolant 59 as cooled by the heat exchanger 53 passes through the semiconductor package 40, the heat transfers to the coolant 59, which is cooler than the semiconductor package 40, thereby cooling the semiconductor package 40. In particular, by bringing the coolant 59 into direct contact with the semiconductor chip 30, the semiconductor package 40 is efficiently cooled.

A coolant reservoir 51 may be additionally installed at the first coolant pipe 52a to restrain a temperature rise in the coolant 59 while the coolant 59 passes through the first coolant pipe 52a prior to entering the semiconductor package 40. The pump 54 may be installed at the first coolant pipe 52a between the heat exchanger 53 and the coolant reservoir 51.

A filter 55 may be additionally installed at the second coolant pipe 52b to filter out impurities contained in the coolant 59 as arriving from the semiconductor package 40. Preferably, the filter 55 may be installed in the vicinity of the heat exchanger 53.

The coolant 59 may be, for example, water, ethyl alcohol, or a fluorine compound.

The semiconductor package 40 of the first example embodiment of the present invention is a ball grid array (BGA) type package. The semiconductor chip 30 is hermetically attached to the upper surface of a substrate 41. Solder balls 49 act as external interface terminals on the lower surface of the substrate 41. Electrode pads 32 of the semiconductor chip 30 are electrically connected with the substrate 41 via bonding wires 45. The semiconductor chip 30 and the bonding wires 45 on the upper surface of the substrate 41 are protected by a molding compound 46 made by encapsulation with a liquid plastic resin. In particular, to bring the coolant 59 into direct contact with the semiconductor chip 30 as encapsulated in the molding compound 46, the coolant path 34 is formed in the backside of the semiconductor chip 30, and a coolant tubule 42 connects the coolant path 34 and the coolant pipe 52.

Hereinafter, the semiconductor package 40 according to the first example embodiment is explained in detail.

The substrate 41 is a circuit substrate, on which the semiconductor chip 30 is mounted, and may be, for example, a printed circuit board, a tape circuit substrate, or a ceramic substrate.

A plurality of electrode pads 32 are formed on the active surface 31 of the semiconductor chip 30, and the coolant path 34 can be a groove formation in the backside 33, e.g., opposite to the active surface 31. The coolant path 34 is formed, for example, beginning at one side surface and ending at the opposite side surface, both adjacent to the backside 33, of the semiconductor chip 30.

Specifically, the coolant path 34 comprises an inlet 35, a cooling compartment 36, and an outlet 37. The cooling compartment 36 is formed at the central region of the backside 33. The inlet 35 of a designated length is formed through one side surface to the cooling compartment 36. The outlet 37 of a designated length is formed from the cooling compartment 36 through the opposite side surface.

Figure 15A:
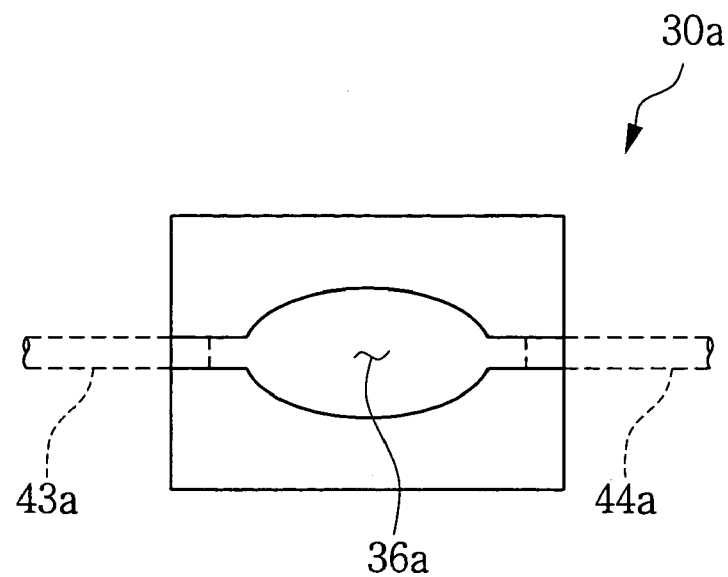
FIGS. 15A to 15E show a variety of shapes of the coolant path formed in the backside of the semiconductor chip.
Figure 15B:
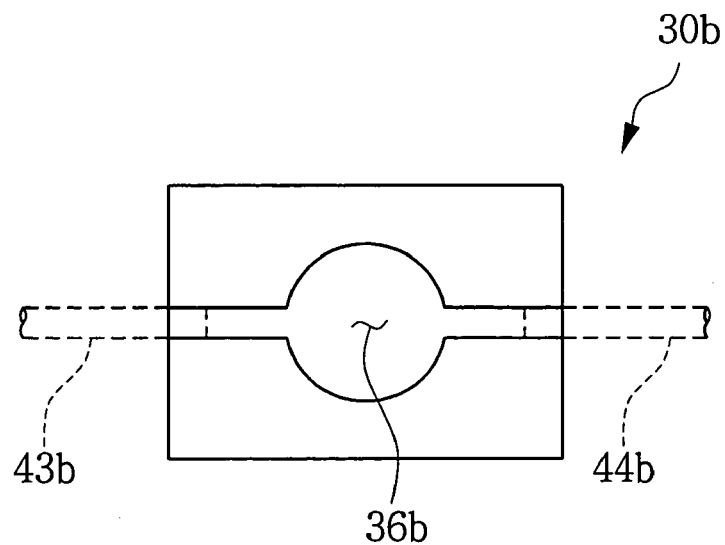
Figure 15C:
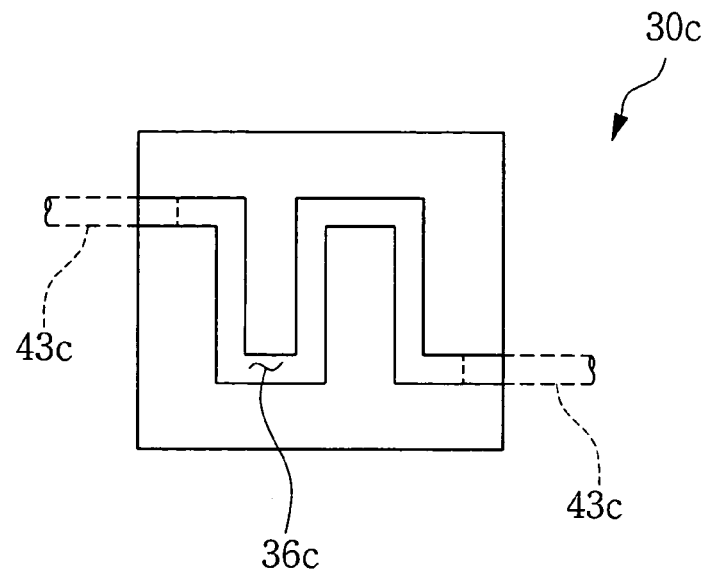
Figure 15D:
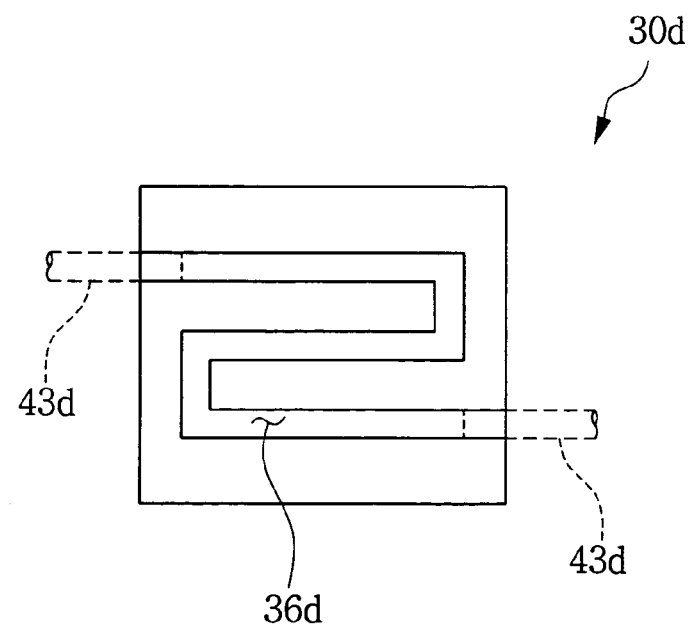
Figure 15E:
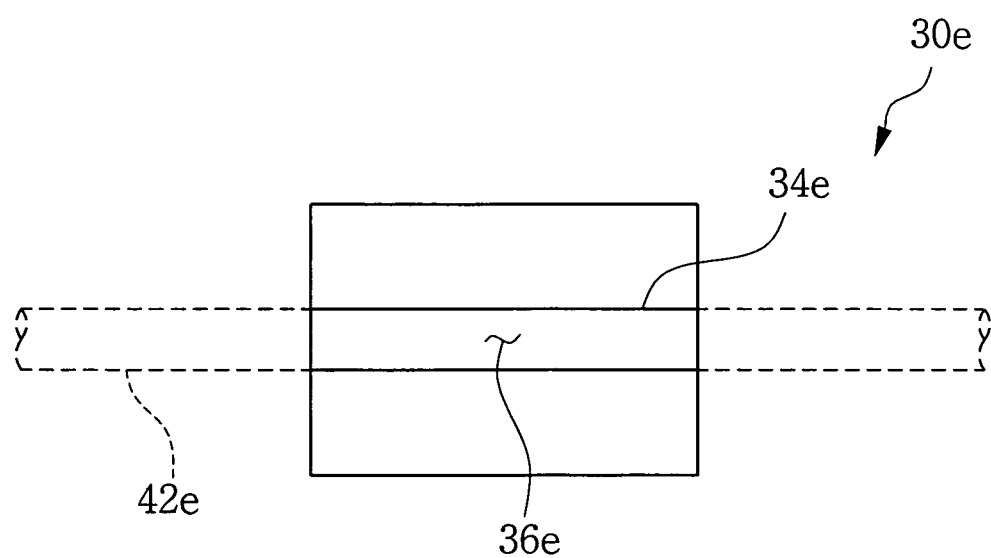

The cooling compartment 36 may be formed in a pocket shape of a designated depth at the central region of the backside 33. The cooling compartment 36 may be deeper and wider than the inlet 35 and the outlet 37. In the first example embodiment, the cooling compartment 36 has a rectangular shape, however, it may have a variety of shapes, as shown in FIGS. 15A to 15E. For example, the cooling compartment may have an oval shape 36a in FIG. 15A, a circular shape 36b in FIG. 15B, or a shape of zigzag 36c in FIG. 15C and 36d in FIG. 15D. As shown in FIG. 15E, a whole coolant path 34e including a cooling compartment 36e may be formed as a continuous linear pipe. The coolant tubule 42 may be divided into a pair of tubules consisting of a coolant-in tubule 43 and a coolant-out tubule 44. For example, in FIGS. 15A to 15D, coolant-in tubules 43a, 43b, 43c, and 43d and coolant-out tubules 44a, 44b, 44c, and 44d are separately installed as a pair in semiconductor chips 30a, 30b, 30c, and 30d respectively. In FIG. 15E, a unified coolant tubule 42e is installed in the coolant path 34e.

While a variety of geometric arrangements for a coolant path have been shown, it will be understood that the particular geometries shown herein are but examples of a broad variety of coolant path shapes bringing coolant in contact with the semiconductor and that the present invention is not limited to a particular coolant path shape.

For robust hermetic adhesion of the semiconductor chip 30 to the substrate 41, it is preferable to form metal layers 38 and 48 on the backside 33, except for the coolant path 34, of the semiconductor chip 30 and on the upper surface of the substrate 41, respectively. The metal layer 38 of the semiconductor chip 30 may be formed through sputtering, and the metal layer 48 on the upper surface of the substrate 41 may be formed through plating or screen-printing. Preferably, the metal layers 38 and 48 may be made of gold (Au) or solder for hermetic adhesion.

A water-repellent coating may be applied to the inner wall of the coolant path 34 through which the coolant 59 passes.

The electrode pads 32 may be formed about the edge of the active surface 31 of the semiconductor chip 30. To avoid damage to the semiconductor chip 30, e.g., due to a force applied during wire bonding with a capillary, it is preferable to form the electrode pads 32 on the edge of the active surface 31 facing the backside 33 but excluding the portion occupied by the cooling compartment 36. In other words, the cooling compartment 36 is concave, e.g., like a pocket at the central region of the backside 33, and with the semiconductor chip 30 mounted on the substrate 41 a space exists between the substrate 41 and the bottom surface of the cooling compartment 36. If the electrode pads 32 were located opposite the cooling compartment 36, the semiconductor chip 30 may be damaged by the force applied during wire bonding with a capillary, because there is relatively less material to structurally resist such force.

The coolant tubule 42 connects the coolant pipe 52 and the coolant path 34 and the coolant 59 passes through the coolant path 34 of the semiconductor chip 30. Namely, one end of the coolant tubule 42 is inserted and connected to the coolant path 34, and the other end is connected to the coolant pipe 52 so as to protrude from the molding compound 46.

The coolant tubule 42 comprises the coolant-in tubule 43 with one end inserted into the inlet 35 of the coolant path 34 to a designated depth. The coolant-out tubule 44 has one end inserted into the outlet 37 of the coolant path 34 to a designated depth. The other end of the coolant-in tubule 43 protrudes from the molding compound 46 and connects to the first coolant pipe 52a. The other end of the coolant-out tubule 44 protrudes from the molding compound 46 and connects to the second coolant pipe 52b. The interface between the coolant tubule 42 and the coolant path 34 is sealed with a sealant 47 to prevent leakage of the coolant 59.

The coolant tubule 42 may be made of a material such as metal, resin, silicon, or gallium arsenide having a thermal expansion coefficient similar to the semiconductor chip 30. The resin may be an epoxy material provided as a molding compound.

FIGS. 7 to 14 show the steps of a manufacturing method of the semiconductor package 40 having the semiconductor chip 30 equipped with the coolant path 34 according to the first example embodiment. In the drawings, the same reference number refers to the same element.

Figure 7:
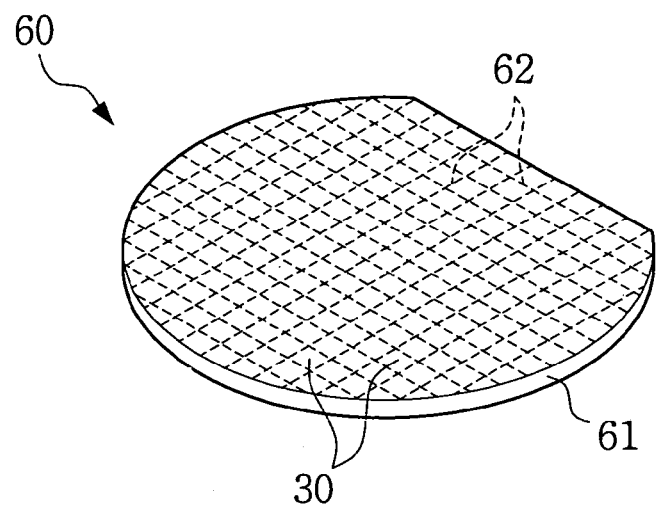
FIGS. 7-14 show the steps of a method of manufacturing the semiconductor package of FIG. 3.
Figure 8:
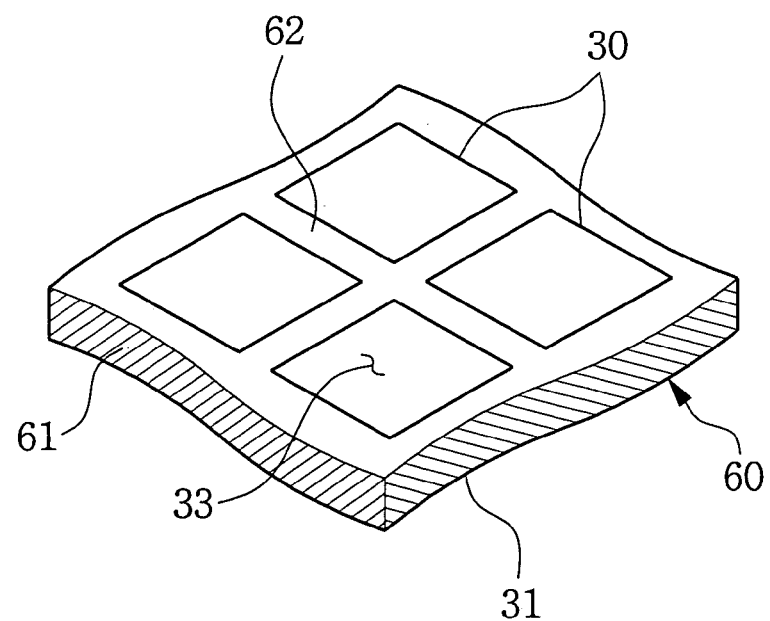

As shown in FIGS. 7 and 8, a wafer 60 made by a semiconductor wafer fabrication process is prepared. FIG. 8 shows a portion of the wafer 60 of FIG. 7.

The wafer 60 comprises a plurality of semiconductor chips 30 simultaneously made on a silicon substrate 61 by the wafer fabrication process. The wafer 60 is to be cut along scribe lines 62 into individual semiconductor chips 30. Electrode pads (not shown) are formed on the active surface 31 of each semiconductor chip 30.

For formation of the coolant path 34 in the backside 33 of the semiconductor chip 30, the wafer 60 can be disposed with the backside 33 facing upward.

Figure 9:
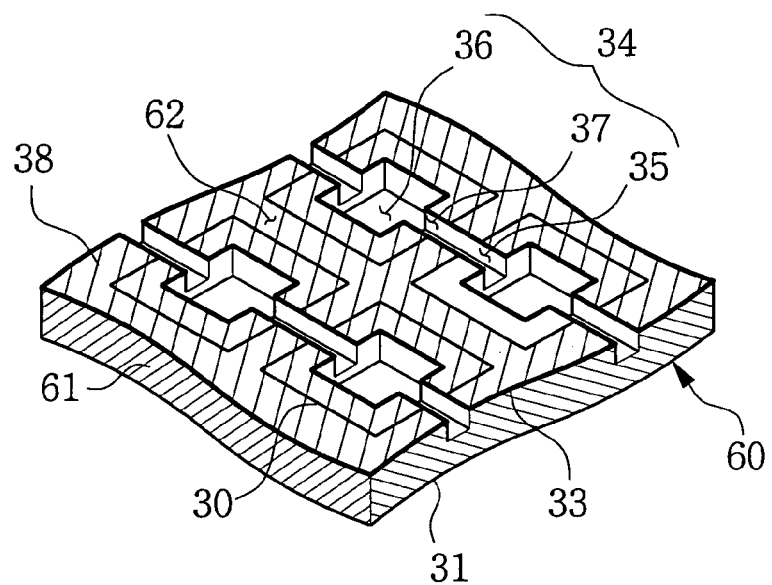

As shown in FIG. 9, the coolant path 34 is formed in the backside 33 of the wafer 60. A dry etching may be utilized to form simultaneously the coolant paths 34 of the semiconductor chips 30. A cooling compartment 36 is formed at the central region of the backside 33 of each semiconductor chip 30. An outlet 37 of the coolant path 34, and an inlet 35 of the coolant path 34 belonging to an adjacent semiconductor chip, are formed connecting each to the other across the scribe line 62. Because the semiconductor chips 30 in the wafer 60 are aligned in rows and columns, the coolant paths 34 of the semiconductor chips 30 in a given row or a given column may be simultaneously formed in communication with one another. In the present example embodiment, the coolant paths 34 connect one another along the rows.

A metal layer 38, for hermetic adhesion, is formed on the backside 33 of the wafer 60. The metal layer 38 of the semiconductor chip 30 may be formed through sputtering. Preferably, for adequate hermetical adhesion the metal layer 38 may be made of gold (Au) or solder.

Figure 10:
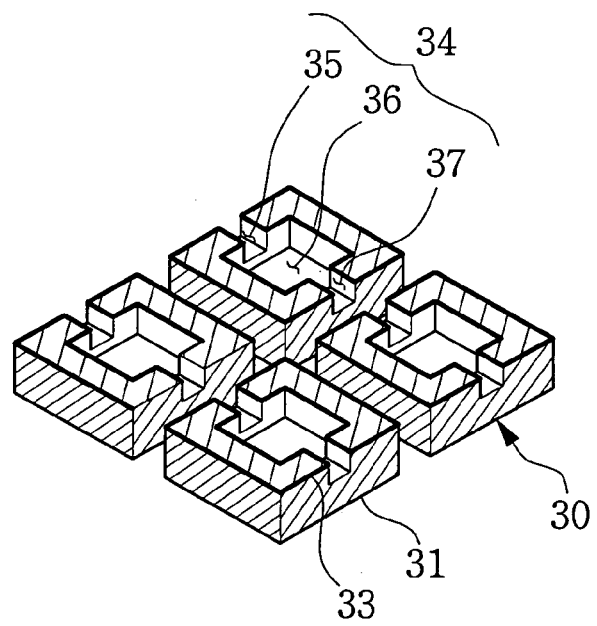

As shown in FIG. 10, the wafer 60 is cut into individual semiconductor chips 30. The wafer 60 may be cut along the scribe lines 62 with a cutting means, such as a diamond saw or laser, thereby separating the inlet 34 and the outlet 37 of the coolant paths of adjacent semiconductors 30 previously connected to each other across the scribe line 62.

This wafer cutting process may be performed, for example, either with the backside 33 of the wafer facing upward, as in the present example embodiment, or with the active side 31 facing upward.

Figure 11:
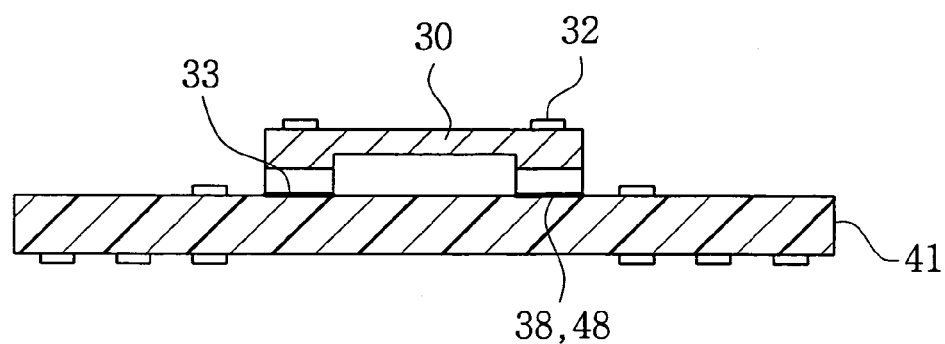

As shown in FIG. 11, the semiconductor chip 30 is mounted on and hermetically sealed with a substrate 41. Preferably, a metal layer 48 of substrate 41 establishes a robust metallic junction with the metal layer 38 of the backside 33 of the semiconductor chip 30. Thus, metal layer 48 as formed on the upper surface of the substrate 41 aids in creating a hermetic seal. The metal layer 48 on the upper surface of the substrate 41 may be formed through plating or screen-printing. Preferably, to establish the hermetic seal, the metal layer 48 may be made of gold (Au) or solder.

A hermetic seal between the semiconductor chip 30 and the substrate 41 prevents leakage of the coolant at the interface therebetween. In the following processes, the hermetic seal may be formed at portions from which the coolant may leak.

The hermetic seal between the semiconductor chip 30 and the substrate 41 may be formed by sealing with an epoxy the edge portion of the semiconductor chip 30 interfacing with the substrate 41, after attachment of the semiconductor chip 30 through a commonly utilized chip attachment process.

Figure 12:
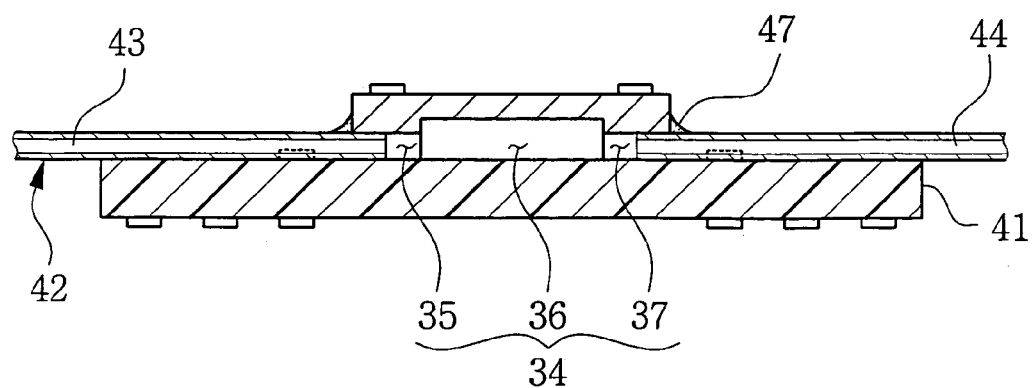

As shown in FIG. 12, a coolant tubule 42 is installed at the coolant path 34 of the semiconductor chip 30. One end of a coolant-in tubule 43 is inserted into the inlet 35 of the coolant path 34 to a designated depth, and hermetically sealed with a hermetic sealant 47. Similarly, one end of a coolant-out tubule 44 is inserted into the outlet 37 of the coolant path 34 to a designated depth, and hermetically sealed with the hermetic sealant 47. Preferably, the ends of the coolant tubule 42 may protrude, for example, from the opposite sides of the substrate 41 for convenient connection with, for example, the coolant pipe 52.

Figure 13:
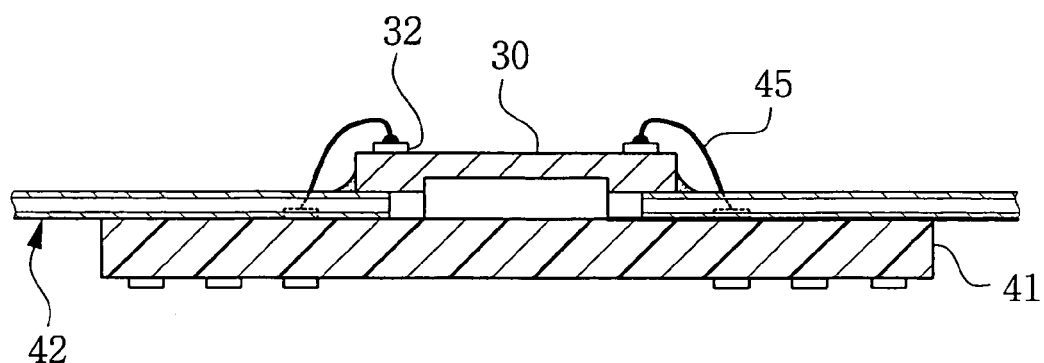

As shown in FIG. 13, the semiconductor chip 30 and the substrate 41 are electrically connected via bonding wires 45. Electrode pads 32 of the semiconductor chip 30 are connected with substrate pads formed on the upper surface of the substrate 41, excluding the portion occupied by the coolant tubule 42, via the bonding wires 45. Wire bonding or bump reverse bonding may be utilized in this process.

Figure 14:
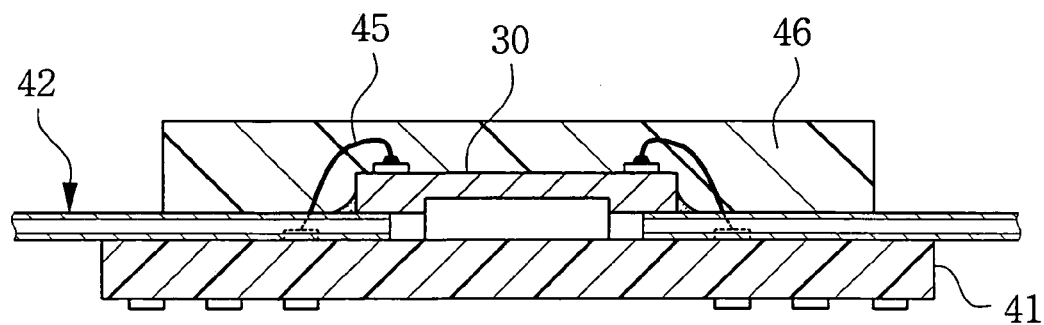

As shown in FIG. 14, a molding compound 46 is formed. The semiconductor chip 30, the bonding wires 45, and the coolant tubule 42 on the upper surface of the substrate 41 are encapsulated with liquid plastic resin to form the molding compound 46 and establish the basic form of package 40. Transfer molding or porting may be used to form the molding compound 46.

Finally, the semiconductor package 40, e.g., as shown in FIG. 4, may be completed by forming solder balls 49 to act as external interface terminals on the lower surface of the substrate 41. The solder balls 49 may be formed, for example, through a ball placement, plating, stencil printing, or metal-jet method. Nickel (Ni) or gold (Au) bumps may be formed instead of the solder balls 49.

Second Example Embodiment

Figure 16:
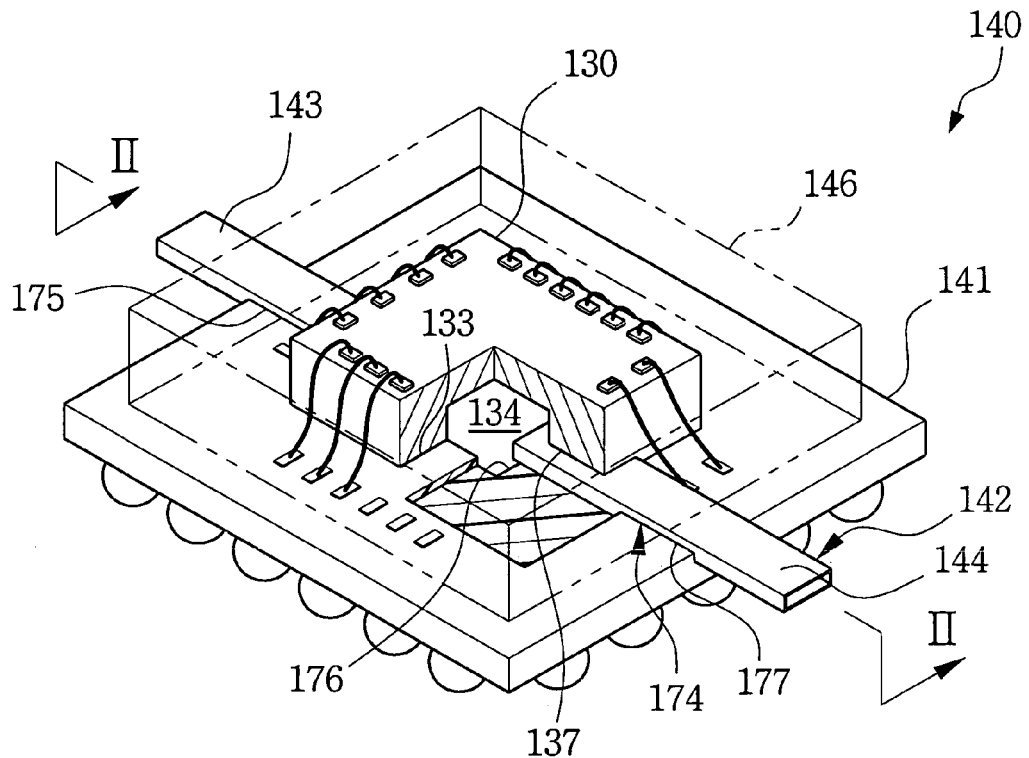
FIG. 16 is a partially sectioned perspective view showing a semiconductor package having a semiconductor chip equipped with a coolant path, according to a second example embodiment of the present invention.
Figure 17:
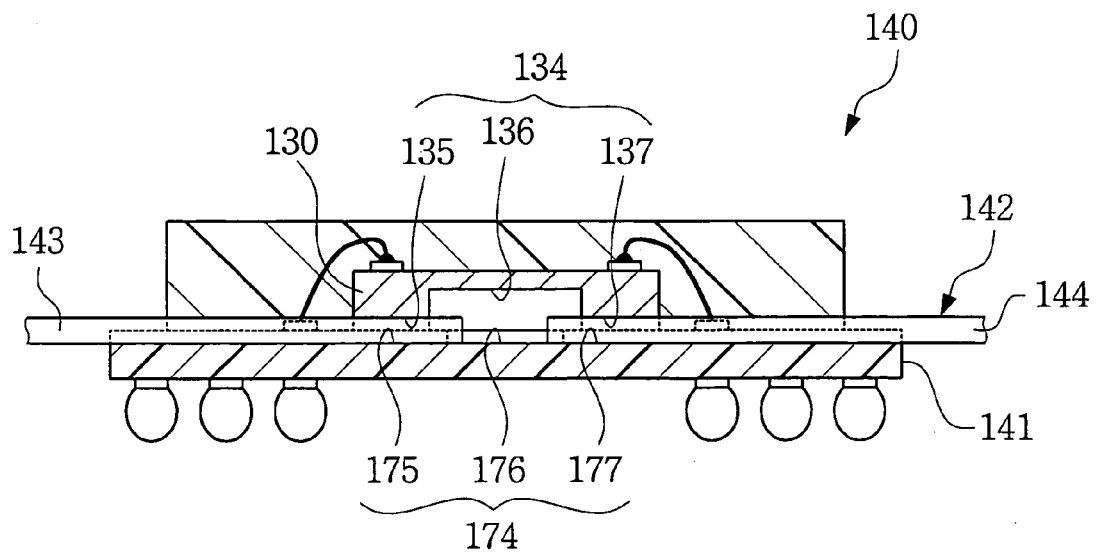
FIG. 17 is a cross-sectional view showing the semiconductor package taken along line II-II in FIG. 16.

In the semiconductor package according to the first example embodiment, the coolant tubule is installed on the upper surface of the substrate. As shown in FIGS. 16 and 17, however, a coolant tubule 142 may be partially embedded in the upper surface of a substrate 141 and connected to a coolant path 134 of a semiconductor chip 130.

In FIGS. 16 and 17, a semiconductor package 140 according to a second example embodiment has a similar structure as that of the semiconductor package according to the first example embodiment with the exception of a substrate coolant path 174 that is formed in the upper surface of the substrate 141 for embedding the lower portion of the coolant tubule 142.

The semiconductor chip 130 mounted and sealed on the upper surface of the substrate 141 has basically the same structure as the one of the first example embodiment. A difference exists in the way of installation of the coolant tubule 142. Namely, while the semiconductor chip 130 of the second example embodiment embeds only the upper portion of the coolant tubule 142, the one of the first example embodiment completely embeds the coolant tubule. Thus, compared with the case of the first example embodiment, the heights of an inlet 135 and outlet 137 of the coolant path 134 may be smaller. Consequently, the semiconductor chip 130 may be, for example, thinner than that of the first example embodiment.

The substrate coolant path 174 comprises a substrate cooling compartment 176, an inlet 175, and an outlet 177. The substrate cooling compartment 176 is formed in the upper surface of the substrate 141 to a designated depth and has a size corresponding to the size of a cooling compartment 136 of the semiconductor chip 130. The inlet 175 and outlet 177 are connected with the substrate cooling compartment 176 and extend each to an opposite side of the substrate 141. The inlet 175 and outlet 177 of the substrate coolant path 174 are formed at sites corresponding to the inlet 135 and outlet 137 of the coolant path 134 of the semiconductor chip 130, respectively. The coolant tubule 142 comprises a coolant-in tubule 143 and a coolant-out tubule 144. The coolant-in tubule 143 is inserted in the inlet 135 of the coolant path 134 and the inlet 175 of the substrate coolant path 174, and the coolant-out tubule 144 is inserted in the outlet 137 and the outlet 177. The interfaces between the coolant tubule 142 and coolant path 134, and between the coolant tubule 142 and substrate coolant path 174, may be hermetically sealed to prevent leakage of the coolant.

In the semiconductor package 140 according to the second example embodiment, the coolant injected into the coolant-in tubule 143 passes through the inlet 175 of the substrate coolant path 174 and the inlet 135 of the coolant path 134, and reaches the substrate cooling compartment 176. Because the substrate cooling compartment 176 is joined with the cooling compartment 136 of the semiconductor chip 130, the space formed by the substrate cooling compartment 176 and the cooling compartment 136 fills with the coolant. The coolant thereby makes direct contact with the bottom surface of the cooling compartment 136 of the semiconductor chip 130 and cools the semiconductor chip 130. The coolant, warmed through heat exchange with the semiconductor chip 130 and the substrate 141, thereafter passes through the coolant-out tubule 144 out of the semiconductor package 140.

Third Example Embodiment

Figure 18:
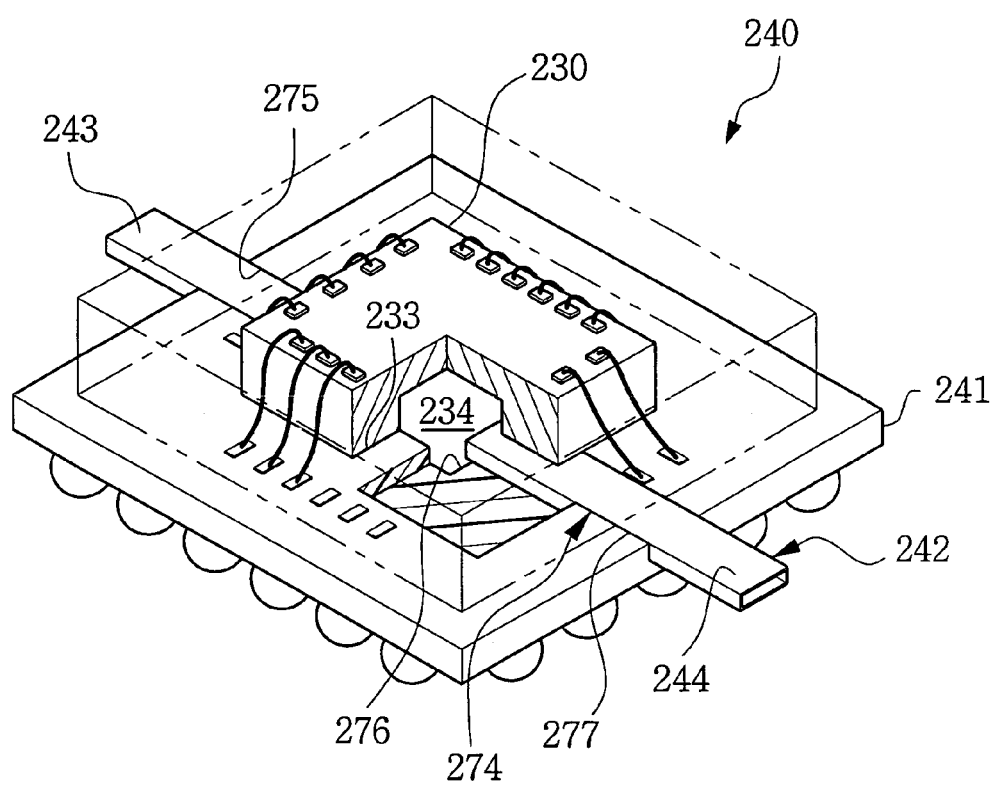
FIG. 18 is a partially sectioned perspective view showing a semiconductor package having a substrate equipped with a substrate coolant path, according to a third example embodiment of the present invention.

In the second example embodiment of the present invention, the coolant tubule is embedded in the substrate coolant path and the coolant path of the semiconductor chip. As shown in FIG. 18, however, a coolant tubule 242 may be completely embedded in a substrate coolant path 274.

In FIG. 18, a semiconductor package 240 according to a third example embodiment has the coolant tubule 242 completely embedded in the substrate coolant path 274 formed in the upper surface of a substrate 241. A semiconductor chip 230 is mounted and hermetically sealed on the upper surface of the substrate 241 so as to be connected with the coolant tubule 242.

A coolant path 234 of a pocket shape is formed at the central region of the backside 233 of the semiconductor chip 230. Compared with the case of the first example embodiment, the coolant path 234 of the semiconductor chip 230 comprises only a cooling compartment and needs no inlet or outlet formation.

The substrate coolant path 274 comprises a substrate cooling compartment 276, an inlet 275, and an outlet 277. The substrate cooling compartment 276 is formed in the upper surface of the substrate 241 to a designated depth and has a size corresponding to the size of the coolant path 234 of the semiconductor chip 230. The inlet 275 and outlet 277 are connected with the substrate cooling compartment 276 and extend each to a different side of the substrate 241. Preferably, the inlet 275 and outlet 277 may each be formed at an opposite side of the substrate 241.

The coolant tubule 242 comprises a coolant-in tubule 243 and a coolant-out tubule 244. The coolant-in tubule 243 is connected with the substrate cooling compartment 276 under the semiconductor chip 230 through the inlet 275 of the substrate coolant path 274, and the coolant-out tubule 244 is connected with the substrate cooling compartment 276 through the outlet 277.

The interfaces between the coolant tubule 242 and substrate coolant path 274, and between the coolant tubule 242 and semiconductor chip 230, may be hermetically sealed to prevent leakage of the coolant.

In the semiconductor package 240 according to the third example embodiment, the coolant injected into the coolant-in tubule 243 passes through the inlet 275 of the substrate coolant path 274 and reaches the substrate cooling compartment 276. Because the substrate cooling compartment 276 joins the coolant path 234 of the semiconductor chip 230, the space formed by the substrate cooling compartment 276 and the coolant path 234 fills with the coolant. The coolant makes direct contact with the bottom surface of the coolant path 234 of the semiconductor chip 230 and thereby effectively cools the semiconductor chip 230. The coolant, warmed through heat exchange with the semiconductor chip 230 and the substrate 241, thereafter passes through the coolant-out tubule 244 and out of the semiconductor package 240.

Fourth Example Embodiment

Figure 19:
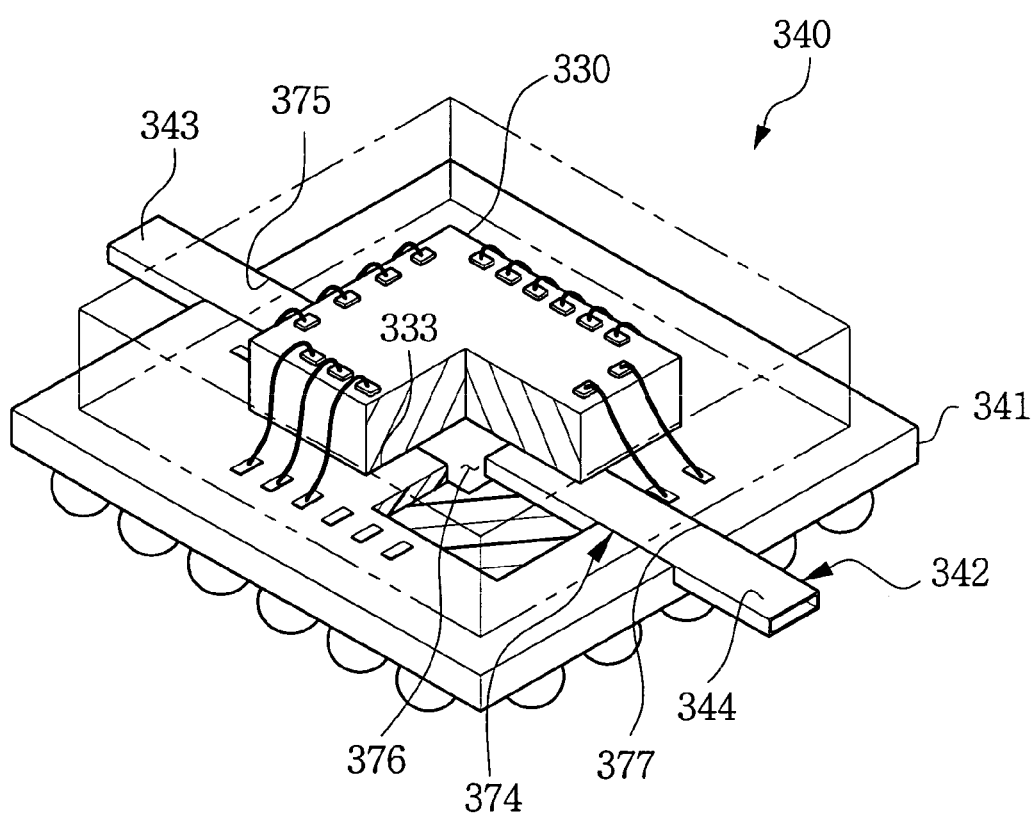
FIG. 19 is a partially sectioned perspective view showing a semiconductor package having a substrate equipped with a substrate coolant path, according to a fourth example embodiment of the present invention.

In each of the previous example embodiments of the present invention, a coolant path is formed in the backside of the semiconductor chip. As shown in FIG. 19, however, by forming a substrate coolant path 374 in the upper surface of a substrate 341 a coolant may be brought into direct contact with the planar back surface 333 of a semiconductor chip 330. In this aspect, chip 330 is of common structure, e.g., a semiconductor chip absent a concave coolant path formation therein. Chip 330 does, however, participate in conducting, e.g., containing, coolant in direct contact therewith as described hereafter.

Referring to FIG. 19, a semiconductor package 340 according to a fourth example embodiment has the same structure as that of the semiconductor package of the third example embodiment with the exception of the mounted semiconductor chip 330 having no concave coolant path formation. Preferably, a substrate cooling compartment 376 may be formed smaller than the back surface 333 of the semiconductor chip 330.

In the semiconductor package 340 of the fourth example embodiment, the coolant injected into the coolant-in tubule 343 passes through the inlet 375 of the substrate coolant path 374, and reaches the substrate cooling compartment 376. As the back surface 333 of the semiconductor chip 330 is exposed to the substrate cooling compartment 376, the coolant fills the substrate cooling compartment 376 and enjoys direct contact with the back surface 333 of the semiconductor chip 330 to effectively cool the semiconductor chip 330. The coolant, warmed through heat exchange with the semiconductor chip 330 and the substrate 341, thereafter passes through the coolant-out tubule 344 out of the semiconductor package 340.

Particular embodiments of the present invention have been shown with coolant paths formed in various structures, e.g., concave formations in the semiconductor and cooperative with the planar surface of the substrate, concave formations in the substrate and cooperative with a planar surface of the semiconductor, or a combination thereof with concave formations in both the semiconductor and the substrate. It will be understood that a broad variety formations could be employed to create a coolant path making contact with the semiconductor chip.

While embodiments of the present invention have been shown with a coolant path entering a first side surface of the semiconductor and exiting a second side surface of the semiconductor, it will be understood that a variety of coolant paths may be formed along alternate routes while still bringing coolant into contact with the semiconductor.

Accordingly, the present invention may have the following advantages.

By forming a coolant path in or adjacent to the backside of a semiconductor chip, the heat generated by the semiconductor chip may be directly dissipated by a coolant circulating through the coolant path.

In the case of mounting the semiconductor chip on a substrate, by forming the coolant path in or at the back surface of the semiconductor chip and in or at the substrate, the heat generated from the semiconductor chip may be directly dissipated by a coolant circulating through the coolant path.

By forming the coolant path having a cooling compartment at a central area of the back surface of the semiconductor chip, the heat generated from the semiconductor chip may be more effectively dissipated.

Malfunction of the semiconductor chip due to the generated heat may be minimized, and product reliability may be improved.

In addition, by forming the coolant path in or adjacent to the back surface of the semiconductor chip or in or adjacent to the upper surface of the substrate, an increase in the thickness of the semiconductor package due to the coolant path may also be minimized.

While example embodiments of the invention have been shown and described in this specification, it will be understood by those skilled in the art that various changes or modifications of the embodiments are possible without departing from the spirit of the invention as defined by the appended claims.

What is claimed is:

1. A semiconductor chip comprising a coolant path of a designated depth formed from a back surface of the semiconductor chip opposite to an active surface having a plurality of electrode pads thereat;
    wherein a portion of the coolant path is disposed between the back surface of the semiconductor chip and a substrate on which the semiconductor chip is mounted.

2. The semiconductor chip of claim 1, wherein the coolant path runs through a first side surface adjoining the back surface to second side surface adjoining the back surface.

3. The semiconductor chip of claim 2, wherein the coolant path comprises:
    an inlet of a designated length formed at the first side surface and directed toward an interior region of the back surface;
    a cooling compartment coupled to the inlet and located at least partially at the interior region of the back surface; and
    an outlet of a designated length coupled to the cooling compartment and formed at the second side surface.

4. The semiconductor chip of claim 3, wherein the cooling compartment is of a designated depth and formed at least partially at the central region of the back surface.

5. The semiconductor chip of claim 4 wherein the cooling compartment is a pocket shape.

6. The semiconductor chip of claim 4, wherein the cooling compartment is formed in a zigzag shape.

7. The semiconductor chip of claim 4, wherein the coolant path is a linear shape.

8. The semiconductor chip of claim 1, further comprising a metal layer formed on the back surface to hermetically adhere the semiconductor chip to a second structure.

9. The semiconductor chip of claim 1, wherein the coolant path includes a water-repellent coating.

10. A semiconductor package comprising:
    a semiconductor chip having a coolant path of a designated depth formed from a back surface of the semiconductor chip opposite to an active surface having a plurality of electrode pads thereon;
    a substrate hermetically sealed to the back surface of the semiconductor chip and including a plurality of substrate pads;
    at least one coolant tubule coupled to the coolant path;
    a plurality of bonding wires to electrically couple the electrode pads and the substrate pads;
    a plastic resin molding compound encapsulating the semiconductor chip, portions of the at least one coolant tubule, and the plurality of bonding wires; and
    an external interface terminal formed on a surface of the substrate.

11. The semiconductor package of claim 10 wherein the at least one coolant tubule comprises a single coolant tubule extending through the coolant path with first and second ends of the coolant tubule protruding from the molding compound.

12. The semiconductor package of claim 10 wherein the at least one coolant tubule comprises a first coolant tubule and a second coolant tubule, the first coolant tubule having a first end coupled to a first end of the coolant path and having a second end protruding from the molding compound, the second coolant tubule having a first end coupled to a second end of the coolant path and having a second end protruding from the molding compound.

13. The semiconductor package of claim 10, wherein the back surface of the semiconductor chip and a portion of the substrate whereat the semiconductor chip mounts is coated with gold to promote hermetic adhesion of the semiconductor chip to the substrate.

14. The semiconductor package of claim 10, wherein an interface between the at least one coolant tubule and the coolant path is hermetically sealed.

15. The semiconductor package of claim 10, wherein the coolant path comprises:
    an inlet of a designated length formed at a first side surface adjoining the back surface;
    a cooling compartment coupled to the inlet and located at an interior region of the back surface; and
    an outlet of a designated length coupled to the cooling compartment and located at a second side surface adjoining the back surface.

16. The semiconductor package of claim 15, wherein the at least one coolant tubule comprises a coolant-in tubule insertable to a designated depth into the inlet and a coolant-out tubule insertable to a designated depth into the outlet.

17. The semiconductor package of claim 16, wherein the cooling compartment is a pocket-shaped formation located at a central region of the back surface.

18. The semiconductor package of claim 16, wherein the cooling compartment is a zigzag-shaped formation.

19. The semiconductor package of claim 10, wherein the coolant path is formed linearly in the back surface.

20. The semiconductor package of claim 19, wherein the coolant tubule is insertable into the coolant path.

21. The semiconductor package of claim 10, further comprising a substrate coolant path that is formed on an upper surface of the substrate whereat the semiconductor mounts, and is coupled to the coolant path having a pocket-shape at the central region of the back surface of the semiconductor chip,
    wherein the at least one coolant tubule is connectable to the coolant path of the semiconductor chip through the substrate coolant path.

22. The semiconductor package of claim 21, wherein the substrate coolant path comprises:
    a substrate cooling compartment formed to a designated depth on the upper surface of the substrate in a size corresponding to the coolant path;

an inlet coupled to the substrate cooling compartment and extending toward a first side surface of the substrate; and an outlet coupled to the substrate cooling compartment and extending toward a second side surface of the substrate.

23. The semiconductor package of claim 22, wherein the at least one coolant tubule comprises a coolant-in tubule coupled to the substrate cooling compartment under the semiconductor chip via the inlet of the substrate coolant path, and a coolant-out tubule coupled to the substrate cooling compartment under the semiconductor chip via the outlet of the substrate coolant path.

24. The semiconductor package of claim 10, wherein the at least one coolant tubule is made of a material chosen from metal, resin, silicon, and gallium arsenide.

25. A semiconductor package comprising:
a semiconductor chip having a plurality of electrode pads on the active surface thereof;
a substrate having an upper surface on which the back surface of the semiconductor chip is hermetically attachable, and a substrate coolant path formed to a designated depth in the upper surface and passing through the back surface of the semiconductor chip;
a coolant tubule coupled to the substrate coolant path to circulate a coolant through the substrate coolant path;
a plurality of bonding wires to electrically couple the electrode pads of the semiconductor chip with substrate pads of the substrate;
a plastic resin molding compound encapsulating the semiconductor chip, at least a portion of the coolant tubule, and the plurality of bonding wires on the upper surface of the substrate, wherein first and second ends of the coolant tubule protrude from first and second side surfaces, respectively, of the molding compound; and
an external interface terminal on the lower surface of the substrate.

26. A system for cooling a semiconductor package comprising:
a semiconductor chip having a coolant path of a designated depth formed from a back surface of the semiconductor chip opposite to an active surface having a plurality of electrode pads thereon;
a substrate hermetically sealed to the back surface of the semiconductor chip and including a plurality of substrate pads;
at least one coolant tubule coupled to the coolant path;
a plurality of bonding wires to electrically couple the electrode pads and the substrate pads;
a plastic resin molding compound encapsulating the semiconductor chip, portions of the at least one coolant tubule, and the plurality of bonding wires;
an external interface terminal formed on a surface of the substrate;
a coolant reservoir;
a coolant pipe connecting the coolant reservoir and the at least one coolant tubule to circulate coolant from the coolant reservoir through the coolant path back to the coolant reservoir;
a heat exchanger cooling the coolant coming from the coolant path; and
a pump installed at the coolant pipe to force the coolant to circulate.

27. The system of claim 26, further comprising a filter installed serially between the coolant path and the heat exchanger to filter impurities contained in the coolant.

28. The system of claim 27, wherein the pump installable between the heat exchanger and the coolant reservoir.

29. A semiconductor package comprising:
a substrate; and
a semiconductor chip mountable to the substrate, to form in cooperation with the substrate a coolant path including portions thereof bounded by the semiconductor chip.

30. A semiconductor package according to claim 29 wherein the semiconductor includes a semiconductor coolant path formation comprising:
a central concave portion;
an inlet in communication with the central concave portion; and
an outlet in communication with the central concave portion.

31. A semiconductor package according to claim 30 wherein the substrate comprises a planar formation cooperative with the semiconductor coolant path formation to establish the coolant path.

32. A semiconductor package according to claim 29 wherein the substrate includes a substrate coolant path formation comprising:
a central concave portion;
an inlet formation in communication with the central concave portion; and
an outlet formation in communication with the central concave portion.

33. A semiconductor package according to claim 32 wherein the semiconductor chip comprises a planar formation cooperative with the substrate coolant path formation to establish the coolant path.

34. A semiconductor package according to claim 29 wherein the substrate includes a concave substrate coolant path formation and the semiconductor chip includes a concave semiconductor coolant path formation cooperative with the substrate coolant path formation to establish the coolant path.

35. In combination, an integrated circuit and a substrate, the integrated circuit at its back surface cooperative with the substrate to form a coolant path, each formed to contribute to containment of a coolant when passed along the coolant path and contact with the integrated circuit.

36. A combination according to claim 35 further comprising a circulation conduit coupling a first end of the coolant path and a second end of the conduit path to carry the coolant to and from, respectively, the coolant path.

37. A combination according to claim 36 further comprising a pump to move the coolant along the conduit and the coolant path.

38. A combination according to claim 37 further comprising a heat exchanger to carry heat energy out of the coolant.

39. A combination according to claim 38 further comprising a filter along the conduit to capture particulates in the coolant.

40. A combination according to claim 39 further comprising the coolant.

41. A combination according to claim 40 where the coolant is a material chosen from water, ethyl alcohol, and a fluorine compound.

42. The semiconductor chip of claim 1, where a portion of the coolant path is installed on the upper surface of the substrate.

43. The semiconductor chip of claim 1, where a portion of the coolant path is partially or fully embedded in the upper surface of the substrate.

* * * * *